(12) United States Patent
Maehara

(10) Patent No.: US 6,421,188 B1
(45) Date of Patent: Jul. 16, 2002

(54) OPTICAL ELEMENT

(75) Inventor: Hiroshi Maehara, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/542,340

(22) Filed: Apr. 5, 2000

(30) Foreign Application Priority Data

Apr. 6, 1999 (JP) .............................. 11-099309

(51) Int. Cl.⁷ .............................. G02B 3/02; G02B 3/08

(52) U.S. Cl. .................. 359/741; 359/743; 359/719; 359/720

(58) Field of Search ................................ 359/741, 743, 359/719, 796, 821, 724, 720, 721, 722, 725; 355/53; 430/316

(56) References Cited

U.S. PATENT DOCUMENTS 3,849,097 A * 11/1974 Giffen et al. .................. 65/33
3,992,136 A * 11/1976 Shaffer ........................ 431/94
6,317,274 B1   11/2001 Kato, et al. ................. 359/742

FOREIGN PATENT DOCUMENTS

JP              03141535 A  *  7/1991

* cited by examiner

Primary Examiner—Georgia Epps
Assistant Examiner—Timothy J. Thompson
(74) Attorney, Agent, or Firm—Fitzpatrick, Cella, Harper & Scinto

(57) ABSTRACT

An optical element is provided with a film having a stress effective to sufficiently suppressing unwanted deformation of the optical element. This accomplishes very small aberration of the optical element and assures precise pattern transfer as the same is used in a lithographic process.

21 Claims, 11 Drawing Sheets

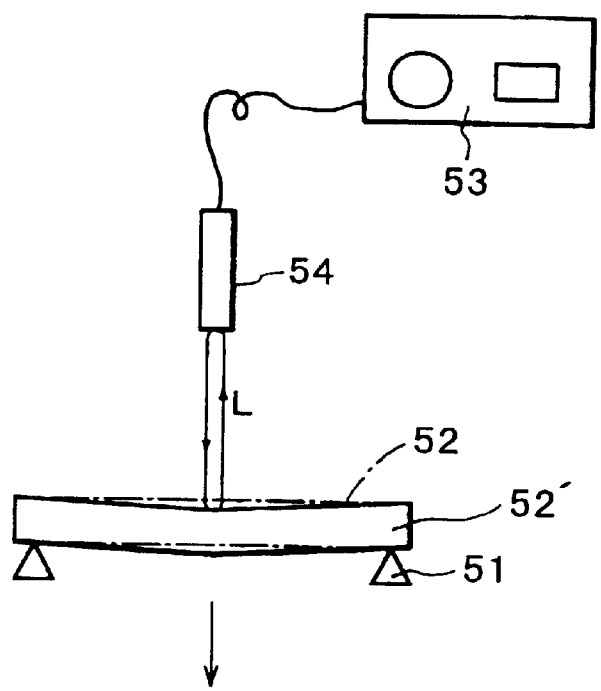
FIG. 7
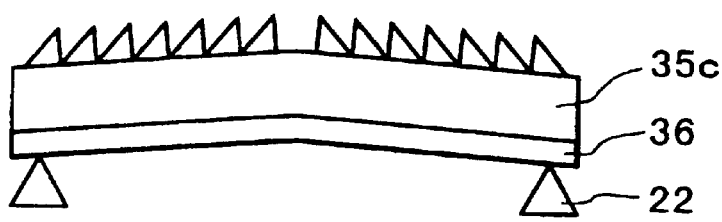
FIG. 8A
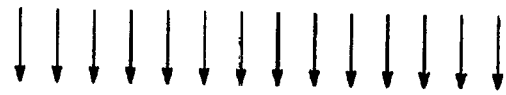
FIG. 8B
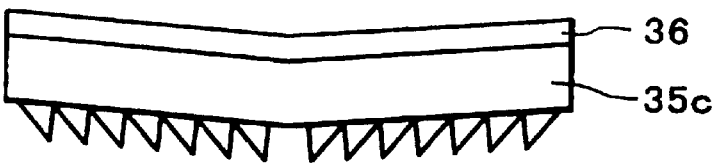
FIG. 8C
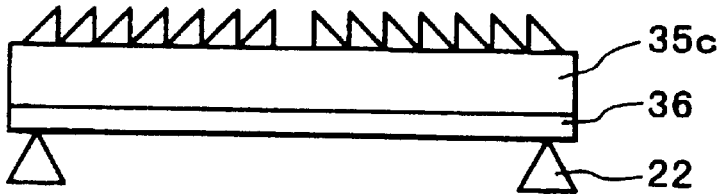

OPTICAL ELEMENT

FIELD OF THE INVENTION AND RELATED ART

This invention relates to an optical element which is usable in an optical system for a camera, a telescope, a microscope, or a semiconductor manufacturing apparatus, for example.

FIG. 16 is a schematic view for explaining gravity (weight) deformation of a certain substrate 1. In FIG. 16, the substrate 1 is made of quartz having a diameter 150 mm and a thickness t. It is supported by supporting means 2, at a distance of radius $\underline{a}$. Where the thickness t of the substrate 1 is small, there occurs a deformation W of the substrate 1 by gravity (weight), at a central portion thereof.

Here, if the thickness t of the substrate 1 is t=0.8 mm, the radius $\underline{a}$ of the supporting means 2 is a=70 mm, the Young's modulus E of quartz is $E=7.31\times10^4 N/mm^2$, the Poisson's ratio $\upsilon$ is $\upsilon=0.17$, the density $\rho$ is $\rho=2.22\times10^{-6} Kg/mm^3$, the amount of deformation W can be determined in accordance with equation (1) below, and the deformation amount at the central portion of the substrate 1 is W=7.2 microns.

$$W=3(1-\upsilon^2)9.81\rho ta^2\{(5+\upsilon)a^2/(1+\upsilon)\}/16Et^3 \quad (1)$$

FIG. 17 is a schematic view of a binary optics element 11 which is a diffractive optical element having a very small thickness. If the binary optics element 11 is supported by supporting means 2 of a radius 70 mm, then, as shown in FIG. 18, there will occur deformation in the thin binary optics element 11 due to the gravity, like the example of FIG. 16.

SUMMARY OF THE INVENTION

It is an object of the present invention to provide an optical element by which deformation such as described above can be avoided or reduced to a level that can be disregarded.

The amount of deformation of an optical element due to the gravity (weight) or the like can be predicted, by calculation, in accordance with the shape or material of the optical element or with the holding method for the optical element, for example. Also, any optical measurement device may be used to practically measure the amount of deformation. In accordance with the present invention, an optical element may be provided with a film formed on the surface thereof and having a stress value effective to produce a deformation amount cancelling the deformation amount as described above.

More specifically, in accordance with an aspect of the present invention, there is provided an optical element, characterized in that said optical element is provided with a film having a stress for substantially suppressing deformation of said optical element.

The deformation of said optical element may be gravity deformation. The film may comprise an anti-reflection film. The center of deformation of said optical may be substantially registered with an optical center of said optical element. The optical center of said optical element is substantially registered with a center of a substrate.

In accordance with another aspect of the present invention, there is provided an optical instrument having an optical element such as described above.

In accordance with a further aspect of the present invention, there is provided an exposure apparatus having an optical instrument as described above.

In accordance a yet further aspect of the present invention, there is provided a device manufacturing method, comprising the steps of: exposing a wafer to a device pattern by use of an exposure apparatus as described above, and developing the exposed wafer.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 7 is a schematic view of an optical micro-measuring device.

FIGS. 8A–8C are schematic views, respectively, for explaining an optical element according to a third embodiment of the present invention.

DESCRIPTION OF THE PREFERRED EMBODIMENTS

Figure 1:
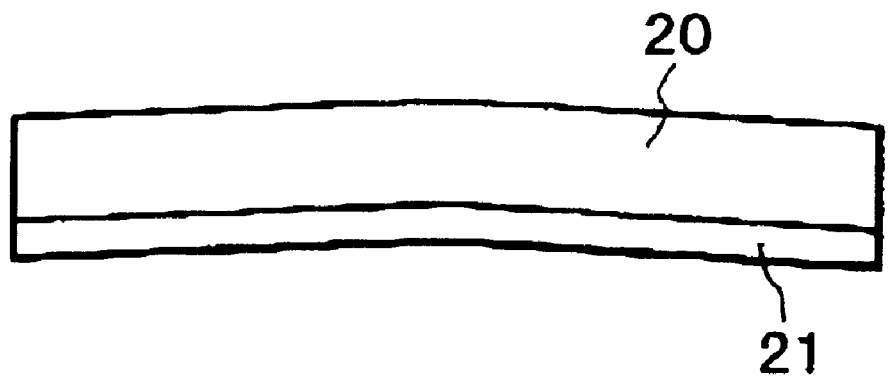
FIG. 1 is a schematic and sectional view of an optical element according to a first embodiment of the present invention.
Figure 2:
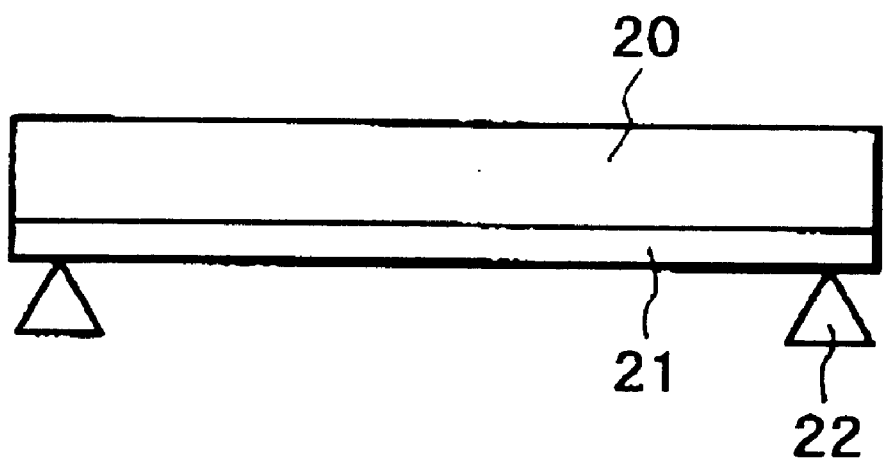
FIG. 2 is a schematic view for explaining the function of the first embodiment.

FIGS. 1 and 2 are schematic and sectional views for explaining an optical element according to a first embodiment of the present invention. As shown in FIG. 1, the optical element comprises a substrate 20 and a stress adjusting thin film 21 having an arbitrary stress and being formed on the bottom face of the substrate 20. In FIGS. 1 and 2, a diffraction grating or a spherical surface formed on the substrate is not illustrated.

With the provision of the stress adjusting thin film 21 and because of the internal stress S of the film 21, the substrate 20 can be deformed. The amount of deformation is determined in dependence upon the material, thickness and shape of the substrate 20 of the optical element, as well as the stress value of the stress adjusting film 21 formed on the substrate 20. Further, it is variable in dependence upon the difference in thermal expansion coefficient between the materials of the substrate 20 and the stress adjusting film 21, and also upon the temperature.

Thus, the internal stress S of the stress adjusting film 21 may be determined so that the deformation amount W resulting from the gravity deformation of the substrate 20 and the deformation amount D due to the internal stress S of the stress adjusting film 21 are cancelled with each other. Then, the optical element may be supported by supporting means 22 as shown in FIG. 2. By doing so, deformation of the substrate 20 can be removed or reduced to a minimum.

Here, if the film thickness of the stress adjusting film 21 is Tf, the internal stress S of the stress adjusting film 21 can be given by the following equation (2) wherein E is a Young's modulus, t is the thickness of the substrate 20, $a$ is the radius of the supporting means, and $\upsilon$ is a Poisson's ratio.

$$S = dEt^2/3Tf(a/2)^2(1-\upsilon) \qquad (2)$$

Figure 16:
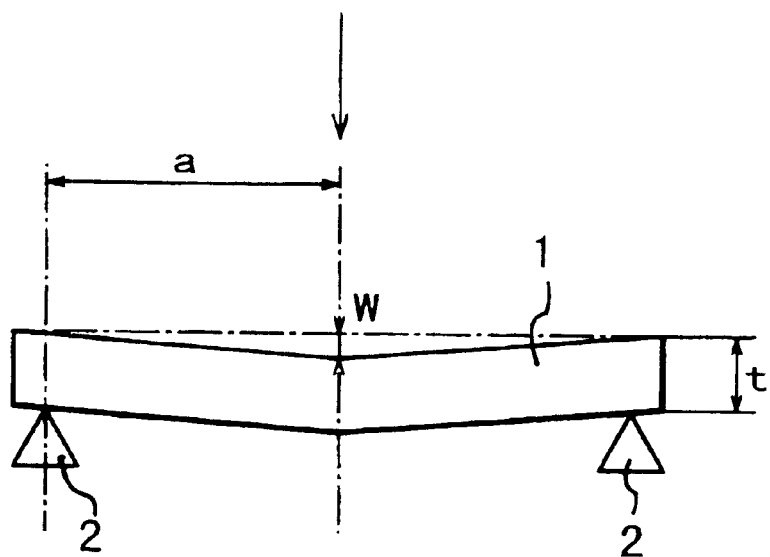
FIG. 16 is a schematic view for explaining deformation of a substrate due to a gravity.
Figure 17:
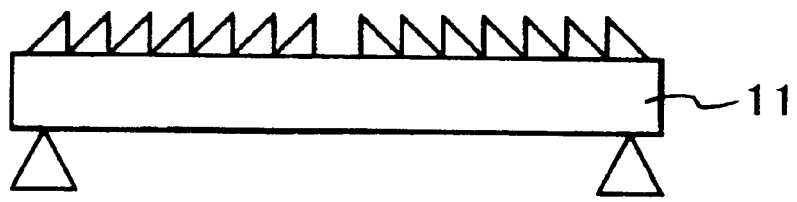
FIGS. 17 and 18 are schematic views, respectively, for explaining deformation of a substrate due to a gravity.
Figure 18:
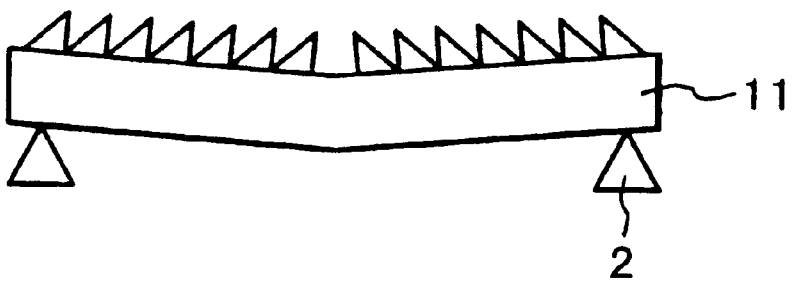

Here, if the deformation amount d due to the internal stress S or the stress adjusting film 21 is d=7.2 microns and the film thickness Tf of the stress adjusting film 21 is Tf=1 micron, then, the stress value necessary for the stress adjusting film 21 to cancel the deformation amount W of the substrate 20 resulting from the gravity deformation, as can be calculated on the basis of specifications in FIG. 16, is S=27 N/mm².

In FIG. 20, the center of deformation of the substrate 20 is placed substantially in registration with the optic center (optical axis) of the substrate 20. This is because, if the deformation center and the optical center are not registered with each other, it leads to production of aberration. Usually, deformation by gravity occurs symmetrically with respect to a geometrical center of the substrate 20. Thus, by forming the substrate 20 so that the geometrical center thereof is aligned with the optical center, the deformation center can consequently be registered with the optical center.

As regards measurement of the internal stress of the stress adjusting film 21, it may be measured on the basis of the amount of warp of the substrate 20. Alternatively, if the stress adjusting film has a crystalline property, by using an X-ray diffraction method or a Raman spectroscopy method, it can be calculated from a displacement in crystal lattice distance of the stress adjusting film 21.

As regards the stress adjusting film 21 to be used, preferably it may be one having small absorption with respect to a wavelength to be used with the optical instrument. Further, it is desirable that the substrate 20 and the stress adjusting film 21 have the same optical constant with respect to the wavelength to be used, or optical constants which are close to each other as much as possible. If the optical constants differ from each other considerably, then the physical interface between the substrate 20 and the stress adjusting film 21 functions as an optical interface, and there occurs a loss of light quantity due to reflection at that interface. As an example, where quartz is used for the substrate 20, silicon dioxide ($SiO_2$) may preferably be used as the material for the stress adjusting film 21.

Figure 3A:
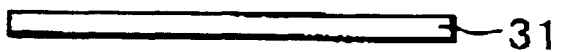
FIGS. 3A–3H are schematic views, respectively, for explaining binary optics element manufacturing processes.
Figure 3B:
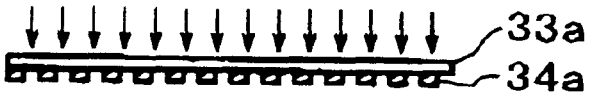

FIGS. 3A–3H show an example of a procedure for manufacturing a binary optics element having a stress adjusting film according to the numerical example described above. FIG. 3A shows a quarts substrate 31 having a thickness 0.8 mm and a diameter 150 mm. At a step shown in FIG. 3B, a photoresist 32 is applied to the substrate 31 in accordance with a spin coating method, to a thickness 0.5 micron. Then, a heat treatment is executed and, subsequently, a smallest pattern of a first reticle 33a is printed on the central portion of the substrate 31 by using a stepper and by using light. Then, a heat treatment is executed again and, thereafter, a development process is performed. By this, a ring-like resist pattern of linewidth 0.5 micron, of the smallest pattern, is produced.

Figure 3C:
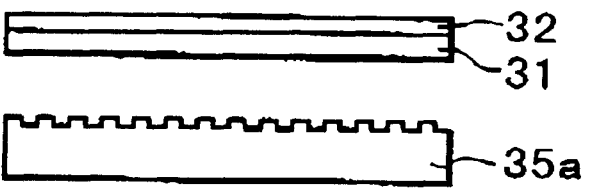
Figure 3D:
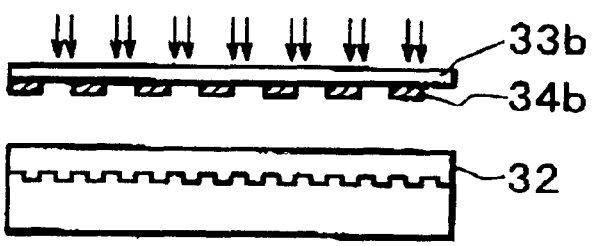
Figure 3E:

Then, while using the thus produced resist pattern as a mask, the quartz substrate 31 is etched to a depth 61 nm in accordance with an ion etching method. After this, the photoresist is removed. By this, a binary optics element 35a with two levels, as shown in FIG. 3C, is produced. Further, as shown in FIG. 3D, a photoresist 32 is applied onto the two-level binary optics element 35a of FIG. 3C. Then, a second reticle 33b having a pitch twice the first reticle 33a is used and, after executing alignment with respect to the etching pattern, the above-described processes are repeated. By this, a binary optics element 35b having a four-level structure such as shown in FIG. 3E is produced.

Figure 3F:
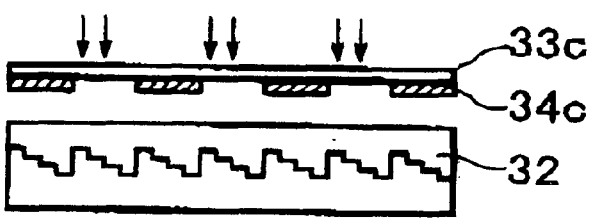
Figure 3G:
Figure 3H:

Thereafter, as shown in FIG. 3F, a third reticle 33c having a pitch twice the second reticle 33b is used and, after executing the etching pattern alignment, processes including exposure and etching are repeated. By this, a binary optics element 35c having an eight-level structure is produced. Subsequently, in accordance with a sputtering method, a stress adjusting film 36 is a thickness 1 micron, being made of silicon dioxide and having a tensile stress 27 N/mm², is formed on the bottom face of the binary optics element 35c.

In a case where an anti-reflection film is to be formed on a very thin binary optics element such as described above, the provision of a stress adjusting film 36 for cancelling gravity deformation as described above may be omitted and, in place of it, the stress value of the anti-reflection film may be controlled to suppress gravity deformation of the optical element.

In that occasion, the material for the anti-reflection film to be used should satisfy the reflection prevention condition with respect to a design wavelength of the optical element. For example, alumina, silicon dioxide, hafnium oxide or any other oxides, or calcium fluoride, magnesium fluoride, lithium fluoride, aluminum fluoride or any other fluorides, may be applied to the surface of the binary optics element 35c in accordance with a sputtering method, a vapor deposition method or a chemical vapor deposition method (CVD), for example, to form a film thereon. Since the deformation amount in such binary optics element 35c is changeable with the internal stress value of the thus formed anti-reflection film as well as the film thickness thereof, during the film forming process the film thickness should also be controlled. While the film thickness can be controlled by a film forming system, a film may be formed once with a thickness larger than a desired thickness and then the film thickness may be adjusted in accordance with an ordinary mechanical polishing process, a CMP (chemical and mechanical polishing) process, a chemical etching process, a RIE (reactive ion etching) process, or an ion-beam etching process or any other dry etching processes. As a further alternative, by using a difference in thermal expansion coefficient between the substrate 31 and the anti-reflection film, a stress may be produced. This provides substantially the same advantageous results.

Figure 4:
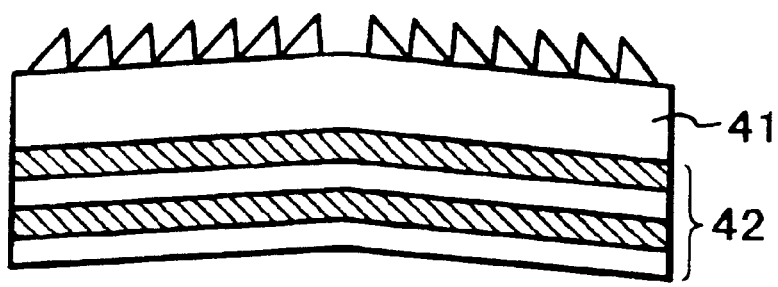
FIG. 4 is a schematic and sectional view of an optical element according to a second embodiment of the present invention.
Figure 5:
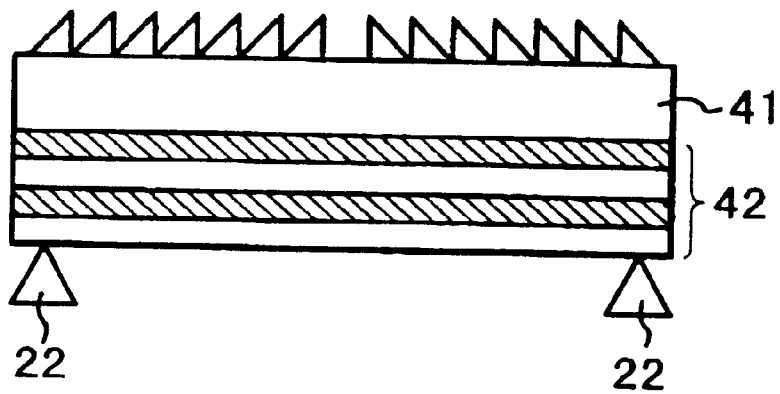
FIG. 5 is a schematic view for explaining the function of the second embodiment.
Figure 6:
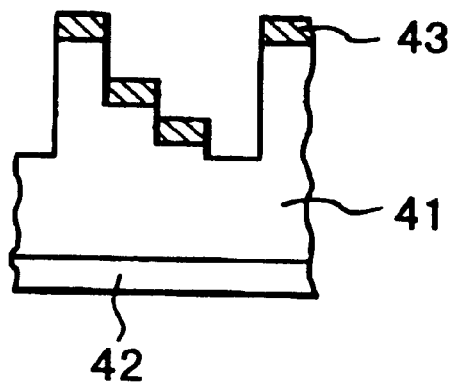
FIG. 6 is a fragmentary enlarged view of the optical element of the second embodiment.

FIGS. 4 and 5 show a second embodiment of the present invention. There is a four-layer film 42 made of silicon dioxide and alumina, which is formed on the bottom face of a binary optics element 41 through a sputtering method. This film 42 has a tensile stress (total stress) of 27 N/mm², and it functions as a stress adjusting film and also an anti-reflection film. As shown in FIG. 5, the binary optics element 41 is supported by supporting means 22, by which deformation at the central portion due to its gravity can be cancelled. Further, as shown in an enlarged sectional view of FIG. 6, the surface of the binary optics element 41 is formed with a very fine step-like structure, less than the wavelength used with the optical element, in accordance with an Ar sputtering method. There may be an anti-reflection layer 43 formed.

Next, adjustment or correction of the stress value of a stress adjusting film 36, will be explained.

FIG. 7 is a schematic view of an optical micro-measuring system. An optical element 52 is supported on a supporting table 51, and laser light L is projected to the optical element 52 from an optical micro-head 54 which is connected to an indicator 53. By comparing the optical element 52 before deformation and the optical element 52' after deformation, the amount of deformation can be measured.

FIG. 8A is a sectional view of a binary optics element, in a certain state, according to a third embodiment of the present invention. A binary optics element 35c with a stress adjusting film 36, having been produced in accordance with the first embodiment, is supported by supporting means 22. In this example, the deformation amount of the binary optics element 35c at the central portion thereof may be measured by using an optical micro-measuring system such as shown in FIG. 7. The result may be that, due to insufficient stress control during formation of the stress adjusting film 36, there is an upward convex deformation of 1 micron produced.

In that occasion, as shown in FIG. 8B, in accordance with a dry etching process, the stress adjusting film 36 as a whole may be etched by 0.02 micron, and after that, it may be placed on the supporting means 22 as shown in FIG. 8C, and the deformation amount at the central portion may be measured again. By this, deformation with respect to a reference plane can be removed.

Figure 9A:
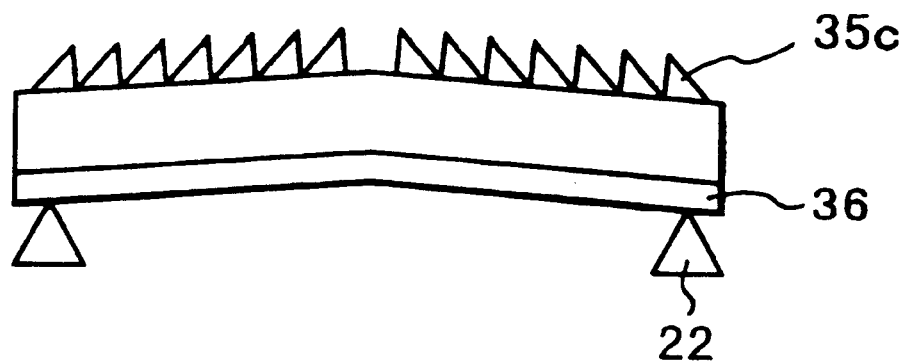
FIGS. 9A–9C are schematic views, respectively, for explaining an optical element according to a fourth embodiment of the present invention.

FIG. 9A is a sectional view of a binary optics element according to a fourth embodiment of the present invention. A binary optics element 35c with a stress adjusting film 36 as manufactured in accordance with the first embodiment is supported by supporting means 22. In this example, the deformation amount of the binary optics element 35c at the central portion thereof, with respect to a reference plane, may be measured. The result may be that, due to insufficient stress control during formation of the stress adjusting film 36, there is an upward convex deformation of 0.3 micron produced.

Figure 9B:
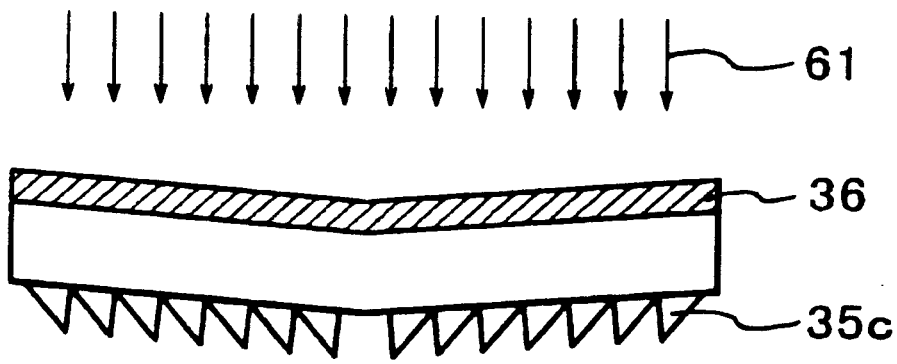
Figure 9C:
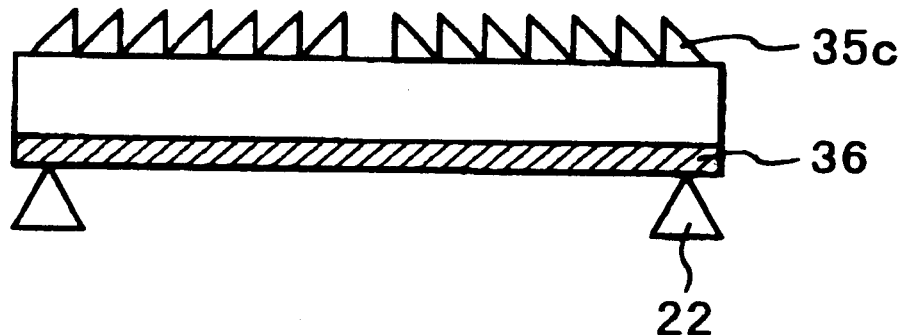

In that occasion, as shown in FIG. 9B, ions 61 may be injected into the stress adjusting film 36 so that the deformation as the optical element is supported is removed to zero or reduced to a small level that can be disregarded. By this, as shown in FIG. 9C, when it is supported by the supporting means 22, the deformation is removed. As regards ions to be injected, helium, neon, argon, krypton, xenon, radon or any other inactive rare gases, or hydrogen, oxygen, fluorine or any other reactive series may be used. If, after formation of the stress adjusting film 36, a stress distribution is produced in this film, for example, ions may be injected in accordance with the stress distribution, to thereby improve the uniformness of stress value.

The procedure described above is not limited to a binary optics element, but it can be applied to various optical components such as a prism, a mirror or a CGH (computer generated hologram), or a photomask or reticle, for example.

Figure 10A:
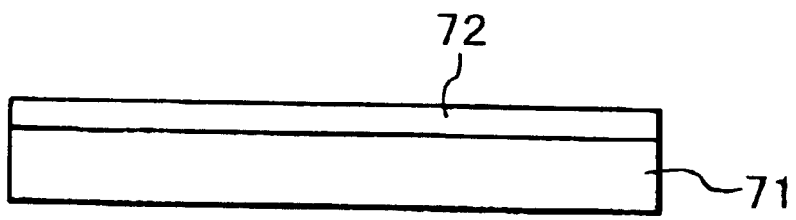
FIGS. 10A–10D are schematic views, respectively, for explaining an optical element according to a fifth embodiment of the present invention.
Figure 10B:
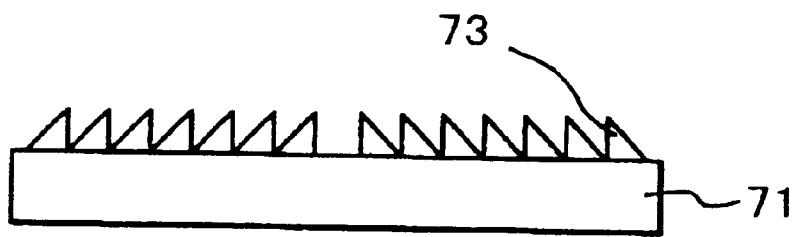
Figure 10C:
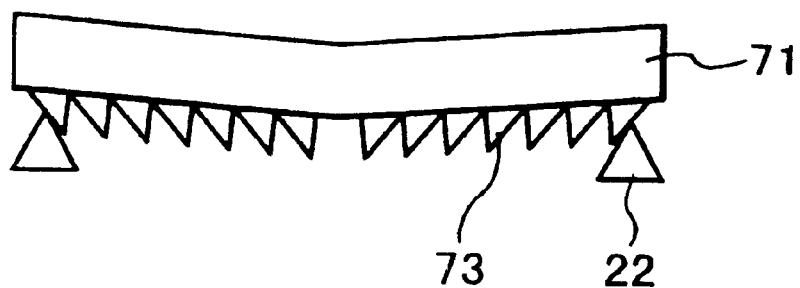

FIGS. 10A–10C show a fifth embodiment of the present invention. In this embodiment, in place of a quartz substrate 20 of the first embodiment, a fluorite substrate 71 is used. Where the Young's modulus E of fluorite is $E=7.58\times10^4$ N/mm², the Poissons's ratio is $\upsilon=0.26$, the density is $\rho=3.18\times10^{-6}$ Kg/mm³, the deformation amount W as the substrate is supported at the position of a radius 70 mm, like the first embodiment, can be calculated in accordance with equation (1) above. The result is that the deformation amount at the center is W=11.3 microns. Where the deformation amount is W=11.3 microns and if the film thickness Tf of the stress adjusting film 74 is Tf=1 micron, the stress value necessary for producing a deformation that cancels this deformation amount is, according to equation (2), S=50 N/mm².

FIG. 10A is a sectional view of a fluorite substrate 71 in this embodiment. In accordance with a sputtering method, a silicon dioxide film 72 of a thickness of about 427 nm is formed on the fluorite substrate 71. Then, as shown in FIG. 10B, a binary optics element 73 is produced on the fluorite substrate 71 through the procedure similar to that of the first embodiment. Subsequently, as shown in FIG. 10C, the face of the binary optics element 73 to be processed is placed down and the substrate is supported by supporting means 22, at a position of a radius 70 mm, like the first embodiment. Measurement may be made to the central portion of the binary optics element 73, and the result may be that there is a concave deformation of 10 microns.

Figure 10D:
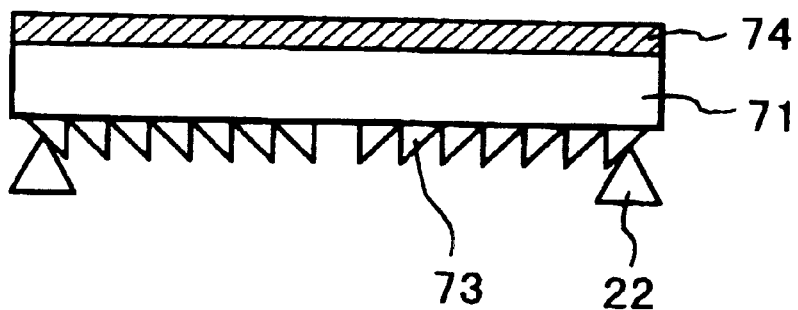

In that occasion, as shown in FIG. 10D, a stress adjusting film 74 made of magnesium fluoride and having a thickness of about 1 micron may be formed on the bottom face of the binary optics element 73 in accordance with a vapor deposition method. Then, the binary optics element 73 may be held again, and the deformation can be removed. The internal stress of the stress adjusting film 74 in this case can be calculated from the physical properties described above and in accordance with equation (2) above, and it is S=45 N/mm². As regards the stress adjusting film 74, calcium fluoride or silicon dioxide may be used.

Figure 11A:
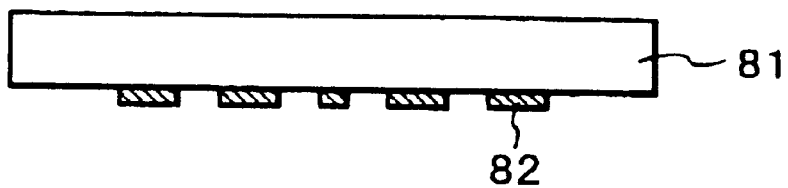
FIGS. 11A–11D are schematic views, respectively, for explaining an optical element according to a sixth embodiment of the present invention.
Figure 11B:
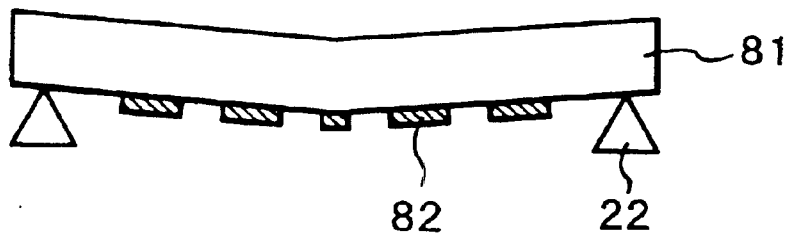
Figure 11C:
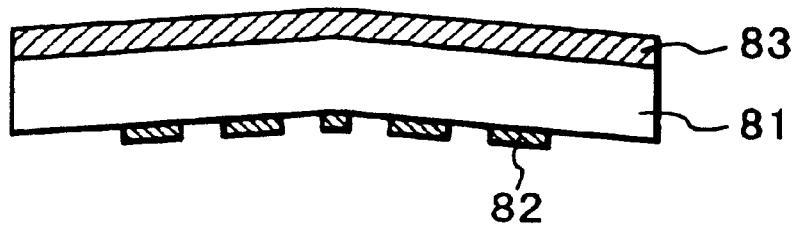
Figure 11D:
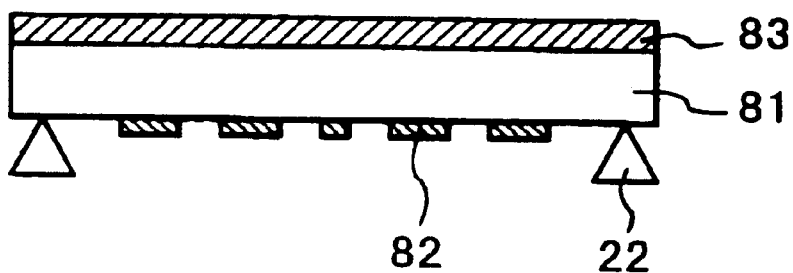

FIG. 11A is a sectional view of a photomask 81 comprising a quartz substrate, according to a sixth embodiment of the present invention. The photomask has a size 150 mm square and a thickness 6.35 mm. A chromium pattern (or mask pattern) 82 is formed on the photomask 81, and it is supported by supporting means 22 at positions of 140 mm square, in the manner similar to a mask chucking method in a semiconductor exposure apparatus. Deformation amount at the central portion of the photomask 81 may be measured, and the result may be that there is a concave deformation of 0.9 micron. In that occasion, the photomask 81 is unloaded from the supporting table 22, and then a stress adjusting film 83 made of silicon dioxide and having a film thickness of about 5 microns and an internal stress S=43 N/mm² (according to the calculation based on equation (2)), is formed on the face of the photomask 81, remote from the surface where the chromium pattern (mask pattern) 82 is formed. Then, it is held by the supporting table 22 as shown in FIG. 11D. By this, deformation of the photomask 81 can be removed.

Figure 12A:
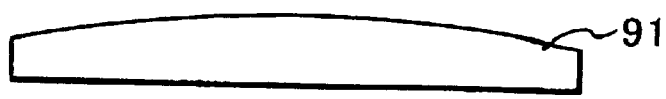
FIGS. 12A–12C are schematic views, respectively, for explaining a plane-convex lens according to a seventh embodiment of the present invention.
Figure 12B:
Figure 12C:
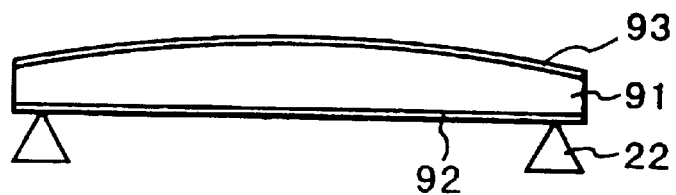

FIG. 12A is a sectional view of a plane-convex lens 91 according to a seventh embodiment of the present invention. This lens has a central thickness of 5 mm and a peripheral thickness of 2 mm. As shown in FIG. 12B, when the lens 91 is held by a supporting table 22 and deformation is measured, there may be a convex deformation of 3.5 microns. Thus, as shown in FIG. 12C, a silicon dioxide film 92 having a tensile stress may be formed on the flat face of the lens 91, while on the other hand, a silicon dioxide film 93 having a compression stress is formed on the upper convex surface of the lens. Then, deformation amount measurement and ion injection may be repeatedly performed, until deformation as the lens is supported is not measured. By this, deformation due to the gravity of the plane-convex lens itself can be removed.

Figure 13:
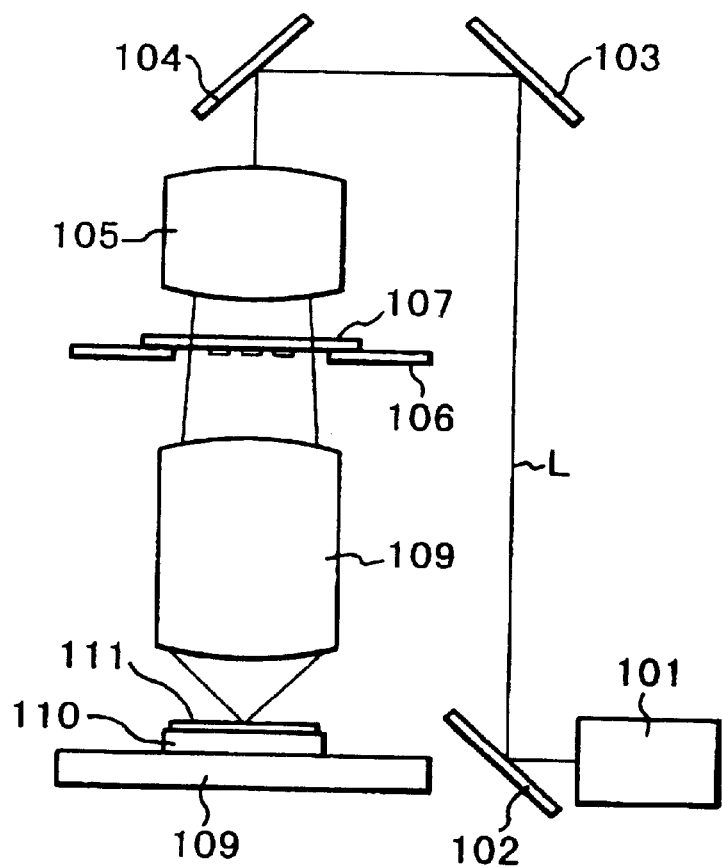
FIG. 13 is a schematic view of a semiconductor exposure apparatus according to an embodiment of the present invention.

FIG. 13 is a schematic view of a semiconductor exposure apparatus into which a binary optics element according to any one of the preceding embodiments is incorporated. An excimer laser output device 101 produces KrF excimer laser light L which is reflected by reflection mirrors 102, 103 and 104. The light is directed to an illumination optical system 105. The illumination optical system 105 serves to produce illumination light having a uniform light intensity distribution. With this illumination light, a reticle 107 held by a mask chuck 106 is illuminated at uniform illuminance. Pattern light from the reticle 107 is reduced by a projection optical system 109 having a binary optics element whose deformation is suppressed sufficiently, and the light is projected on a wafer 111 which is held on a wafer chuck 110, mounted on a stage 109.

With the pattern light (exposure light) from the reticle 107 and through the projection optical system 109, the pattern of the reticle 107 is imaged on the wafer 111 and thus is transferred thereto. Since the semiconductor exposure apparatus of this embodiment uses a binary optics element such as described hereinbefore, deformation of the element is reduced considerably. Therefore, aberration of the optical system 109 is very small, such that the pattern can be transferred to the wafer vary precisely. Although not shown in the drawing, the exposure apparatus of this embodiment is equipped with an alignment optical system for measuring relative deviation between the reticle 107 and the wafer 111, a laser interferometer system for measuring the position of the stage 109, and a conveying system for conveying the wafer 111 and the reticle 107, for example. A stepper having an optical component, comprising a binary optics element, and a KrF excimer laser, such as described above, can be used to produce semiconductor devices.

Figure 14:
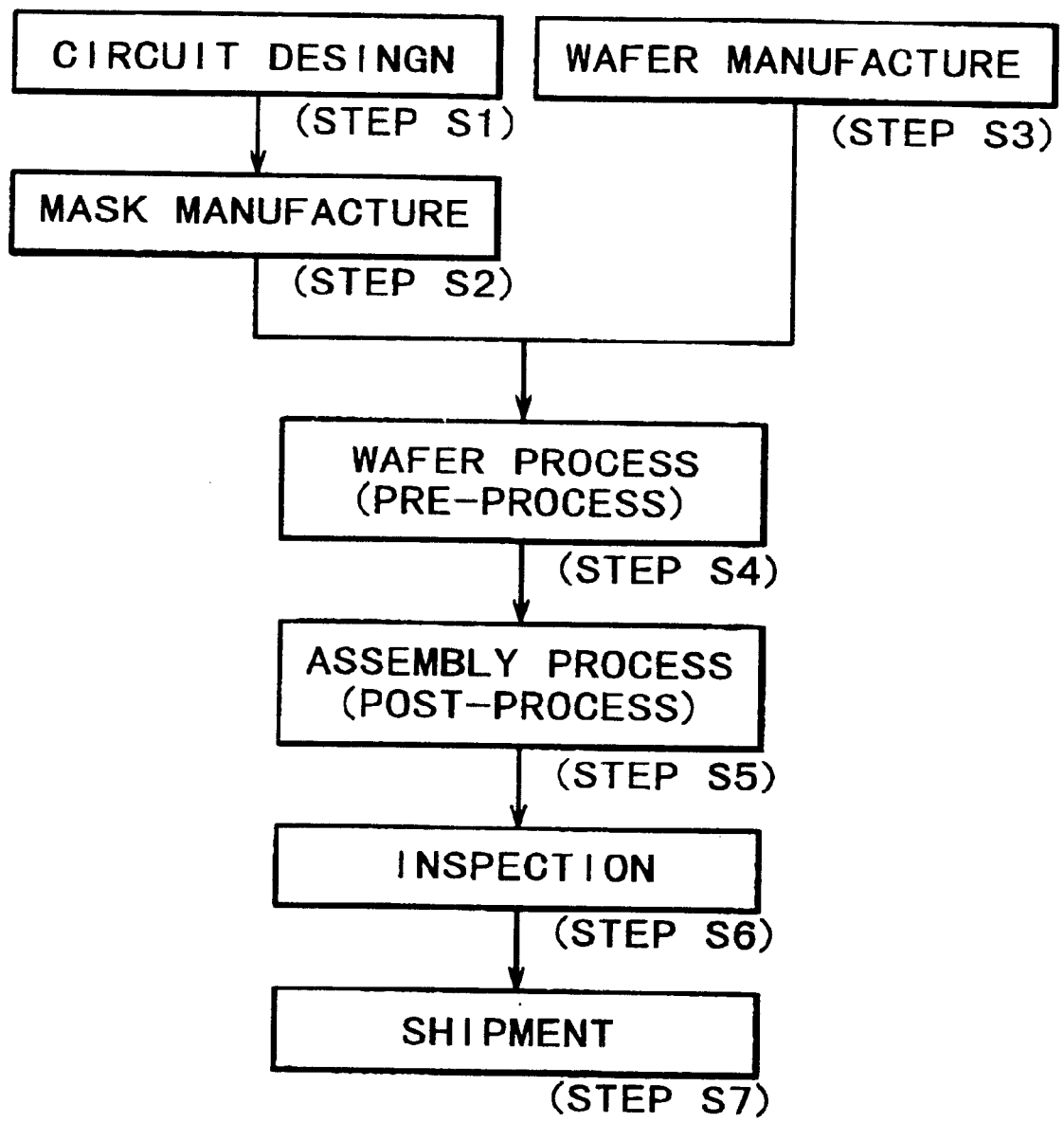
FIG. 14 is a flow chart of semiconductor device manufacturing processes.

FIG. 14 is a flow chart of procedure for manufacture of semiconductor chips such as ICs or LSIs, liquid crystal panels, or CCDs, for example.

Step 1 is a design process for designing a circuit of a semiconductor device. Step 2 is a process for making a mask on the basis of the circuit pattern design. Step 3 is a process for preparing a wafer by using a material such as silicon. Step 4 is a wafer process (called a pre-process) wherein, by using the so prepared mask and wafer, circuits are practically formed on the wafer through lithography. More specifically, a photomask is loaded into an exposure apparatus and is conveyed onto a mask chuck. When the mask is held by the chuck, mask alignment is performed. Subsequently, a wafer is loaded and, by using an alignment unit, any deviation between the photomask and the wafer is detected. A wafer stage is then moved to accomplish alignment between the mask and the wafer. After it is completed, an exposure process is executed. After completion of this exposure, the wafer is moved stepwise for exposure of a subsequent shot, and the procedure from the alignment operation is repeated.

Step 5 subsequent to this is an assembling step (called a post-process) wherein the wafer having been processed by step 4 is formed into semiconductor chips. This step includes an assembling (dicing and bonding) process and a packaging (chip sealing) process. Step 6 is an inspection step wherein operation check, durability check and so on for the semiconductor devices provided by step 5, are carried out. With these processes, semiconductor devices are completed and they are shipped (step 7).

Figure 15:
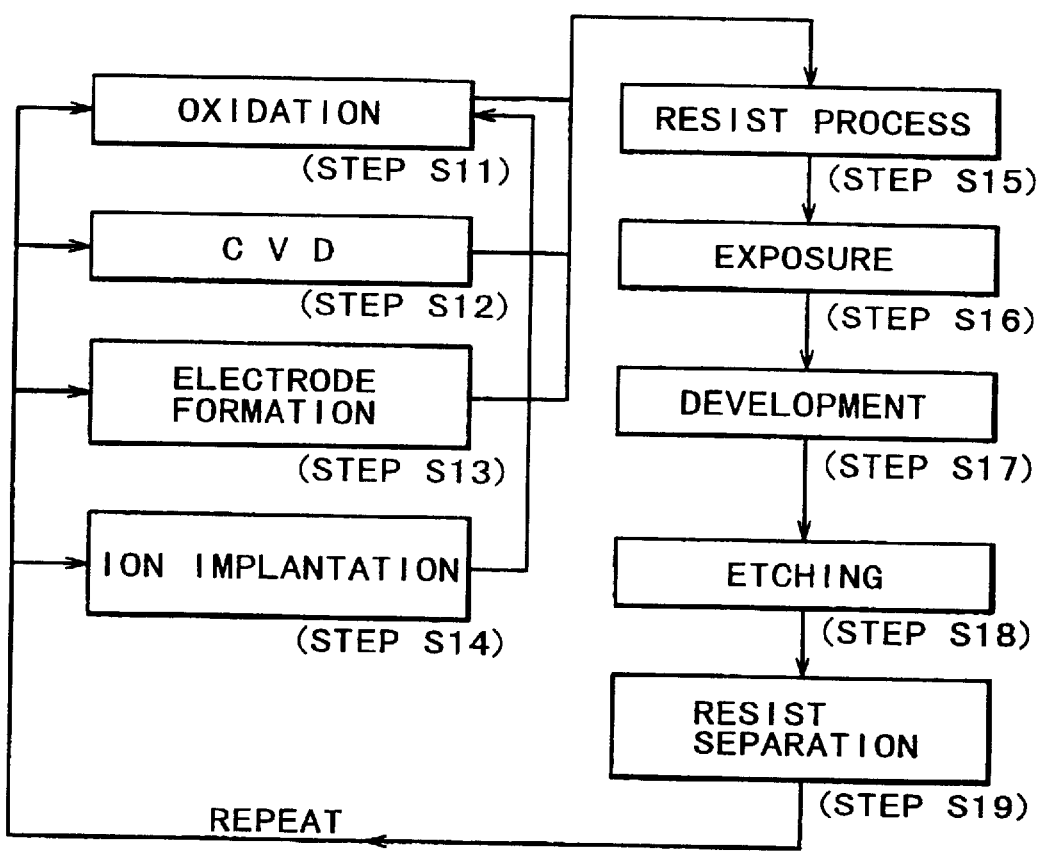
FIG. 15 is a flow chart for explaining details of a wafer process.

FIG. 15 is a flow chart showing details of the wafer process (step 3 in FIG. 14).

Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above, and by using a KrF excimer laser described with reference to FIG. 14. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured.

While the invention has been described with reference to the structures disclosed herein, it is not confined to the details set forth and this application is intended to cover such modifications or changes as may come within the purposes of the improvements or the scope of the following claims.

What is claimed is:

1. An optical element, comprising:
 a film having a stress for substantially suppressing deformation of said optical element,
 wherein said optical element is one of a lens and a diffractive optical element.

2. An optical element, comprising:
 a film having a stress for substantially suppressing deformation of said optical element,
 wherein the deformation of said optical element is gravity deformation.

3. An optical element, comprising:
 a film having a stress for substantially suppressing deformation of said optical element,
 wherein said film comprises an anti-reflection film.

4. An optical element according to claim 2, wherein a center of deformation of said optical element is substantially registered with an optical center of said optical element.

5. An optical element according to claim 4, wherein the optical center of said optical element is substantially registered with a center of a substrate.

6. An optical instrument having an optical element as recited in claim 1.

7. An exposure apparatus having an optical instrument, said optical instrument comprising:
 an optical element comprising a film having a stress for substantially suppressing deformation of said optical element.

8. A device manufacturing method, comprising the steps of:
 exposing a wafer to a device pattern by use of an exposure apparatus as recited in claim 7; and
 developing the exposed wafer.

9. An optical element according to claim 2, wherein said film comprises an anti-reflection film.

10. An optical element according to claim 1, wherein a center of deformation of said optical element is substantially registered with an optical center of said optical element.

11. An optical element according to claim 10, wherein the optical center of said optical element is substantially registered with a center of a substrate.

12. An optical instrument having an optical element, said optical element comprising:

a film having a stress substantially suppressing deformation of said optical element, wherein said optical element is one of a lens and a diffractive optical element.

13. An exposure apparatus having an optical instrument as recited in claim 12.

14. A device manufacturing method, comprising the steps of:

exposing a wafer to a device pattern by use of an exposure apparatus as recited in claim 13; and developing the exposed wafer.

15. An optical instrument having an optical element, said optical element comprising:

a film having a stress for substantially suppressing deformation of said optical element, wherein the deformation of said optical element is gravity deformation.

16. An exposure apparatus having an optical instrument as recited in claim 15.

17. A device manufacturing method, comprising the steps of:

exposing a wafer to a device pattern by use of an exposure apparatus as recited in claim 16; and developing the exposed wafer.

18. An optical instrument having an optical element, said optical element comprising:

a film having a stress for substantially suppressing deformation of said optical element, wherein said film comprises an anti-reflection film.

19. An exposure apparatus having an optical instrument as recited in claim 18.

20. A device manufacturing method, comprising the steps of:

exposing a wafer to a device pattern by use of an exposure apparatus as recited in claim 19; and developing the exposed wafer.

21. An optical instrument having an optical element as recited in either one of claims 2 and 3.

* * * * *

UNITED STATES PATENT AND TRADEMARK OFFICE
CERTIFICATE OF CORRECTION

PATENT NO. : 6,421,188 B1
DATED : July 16, 2002
INVENTOR(S) : Hiroshi Maehara

It is certified that error appears in the above-identified patent and that said Letters Patent is hereby corrected as shown below:

Title page,
Item [56], References Cited, FOREIGN PATENT DOCUMENTS, "03141535" should read -- 3-141535 --.

Column 1,
Line 19, "$\upsilon$ is $\upsilon = 0.17$," should read -- $v$ is $v = 0.17$, --; and "$p = 2.22 \times 10^{-6}$ Kg/mm$^3$," should read -- $p = 2.22 \times 10^{-6}$ kg/mm$^3$, --;
Line 25, "$W = 3(1-\upsilon^2)\ 9.81\rho t a^2\ \{(5 + \upsilon)a^2/(1 + \upsilon)\}16Et^3$" should read
-- $W = 3(1-v^2)\ 9.81\rho t a^2\ \{(5 +v\ )a^2/(1 + v)\}16Et^3$ --; and
Line 58, "optical" should read -- optical element --.

Column 3,
Line 25, "$\upsilon$" should read -- $v$ --; and
Line 28, "$(1-\upsilon)$" should read -- $(1-v)$ --.

Column 4,
Line 4, "quarts" should read -- quartz --; and
Line 33, "is" should read -- of --; and "1 micron," should read -- of 1 micron, --.

Column 6,
Line 7, "$\upsilon = 0.26$," should read -- $v = 0.26$, --; and
Line 8, "Kg/mm$^3$" should read -- kg/mm$^3$ --.

Signed and Sealed this

Twenty-first Day of January, 2003

JAMES E. ROGAN
*Director of the United States Patent and Trademark Office*